US007294904B1

(12) United States Patent
Chee et al.

(10) Patent No.: US 7,294,904 B1
(45) Date of Patent: Nov. 13, 2007

(54) INTEGRATED CIRCUIT PACKAGE WITH IMPROVED RETURN LOSS

(75) Inventors: Soon-Shin Chee, Sunnyvale, CA (US); Ann Chiuchin Lin, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 81 days.

(21) Appl. No.: 11/054,863

(22) Filed: Feb. 10, 2005

(51) Int. Cl.
*H05K 3/02* (2006.01)
*H05K 1/02* (2006.01)
*H01L 23/58* (2006.01)
*H01L 23/66* (2006.01)

(52) U.S. Cl. .............. 257/528; 257/E23.062; 257/E23.079; 257/E23.069; 257/531; 257/532; 257/728; 361/767; 361/768

(58) Field of Classification Search ........ 257/E23.062, 257/E23.079, E23.069, 528, 531, 532, 728; 361/767, 768; 333/185, 236, 34, 246
See application file for complete search history.

(56) References Cited

U.S. PATENT DOCUMENTS

| 5,522,132 | A  | * | 6/1996  | Mattei ................. 29/846 |
| 5,602,672 | A  | * | 2/1997  | Ishimura et al. ............ 359/245 |
| 6,127,901 | A  | * | 10/2000 | Lynch ......................... 333/26 |
| 6,329,715 | B1 | * | 12/2001 | Hayashi ...................... 257/724 |
| 6,369,324 | B1 | * | 4/2002  | Tomie ........................ 174/650 |
| 6,384,701 | B1 | * | 5/2002  | Yamada et al. ............. 333/247 |
| 6,911,734 | B2 | * | 6/2005  | Kikuchi et al. ............. 257/728 |
| 6,933,596 | B2 | * | 8/2005  | Hathaway et al. .......... 257/678 |
| 7,064,627 | B2 | * | 6/2006  | Hsu ............................. 333/34 |
| 2003/0011442 | A1 | * | 1/2003  | Ashoka ..................... 333/116 |
| 2003/0095014 | A1 | * | 5/2003  | Lao et al. ..................... 333/33 |
| 2003/0151133 | A1 | * | 8/2003  | Kinayman et al. .......... 257/713 |
| 2004/0027813 | A1 | * | 2/2004  | Li ............................... 361/767 |
| 2004/0178854 | A1 | * | 9/2004  | Inoue et al. ................ 330/302 |
| 2005/0258548 | A1 |   | 11/2005 | Ogawa et al. .............. 257/778 |
| 2006/0103003 | A1 | * | 5/2006  | Heide et al. ................ 257/700 |
| 2006/0134405 | A1 | * | 6/2006  | Dohring ..................... 428/342 |
| 2006/0175712 | A1 | * | 8/2006  | Lyn et al. ................... 257/784 |

\* cited by examiner

*Primary Examiner*—Alexander Oscar Williams
(74) *Attorney, Agent, or Firm*—Scott Hewett

(57) ABSTRACT

A packaged integrated circuit includes an integrated circuit and a package substrate. A trace in the package substrate includes a first portion and a second, high-inductance, portion. The high-inductance portion of the trace is proximate to a port of the integrated circuit and provides a selected inductance operating in cooperation with the capacitance of the port to reduce return loss from the port.

13 Claims, 4 Drawing Sheets

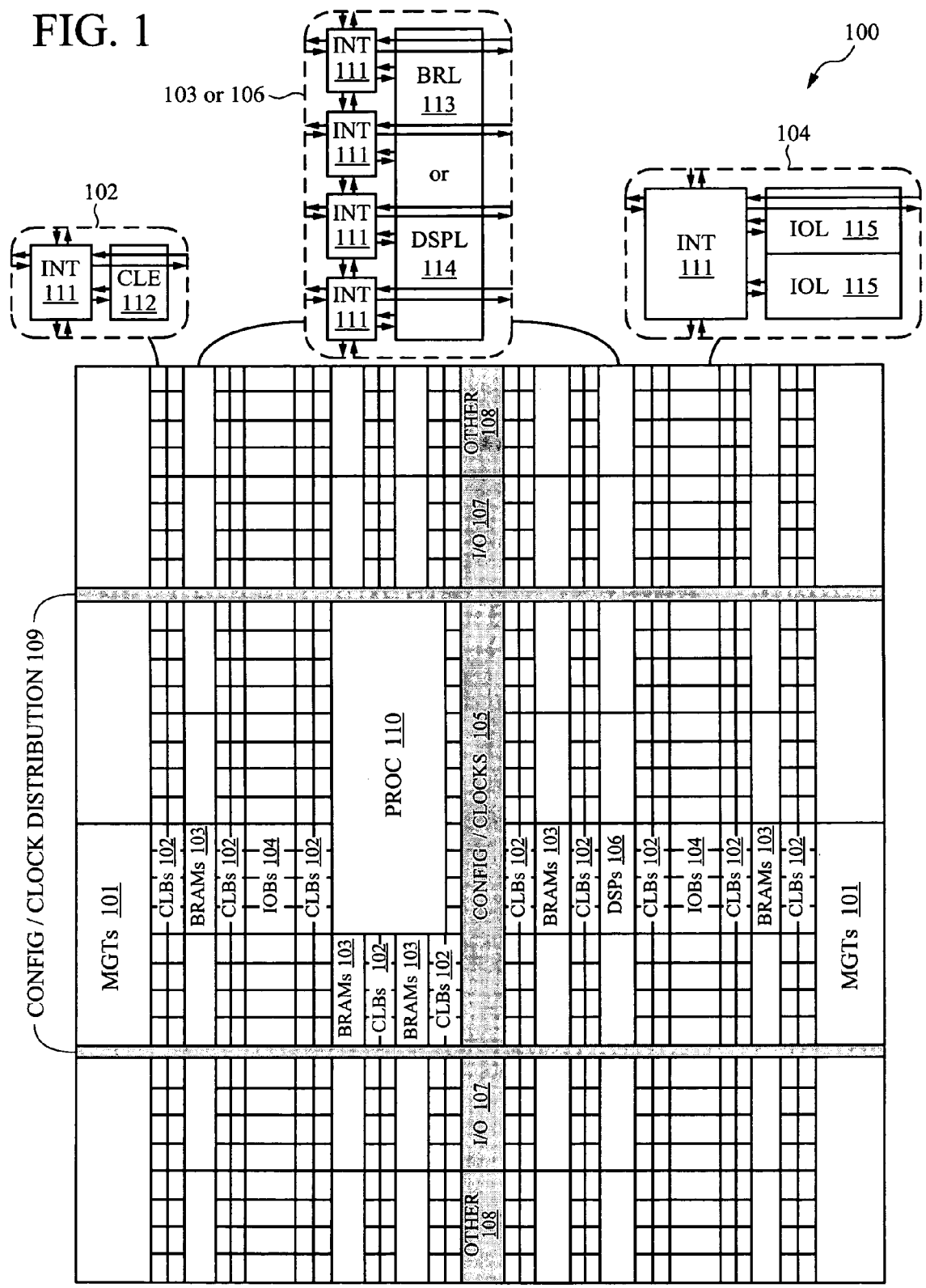

INTEGRATED CIRCUIT PACKAGE WITH IMPROVED RETURN LOSS

FIELD OF THE INVENTION

The present invention relates generally to packages for integrated circuits ("ICs"), and more particularly to packages for use with non-wire-bonded ICs, such as ICs commonly referred to as "flip-chip" ICs.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

ICs have been electrically connected to their packages using wire bonds. Automatic bonding machines are available to quickly and reliably stitch very fine metal wire from bonding pads on the IC to bonding pads on the package base. The bonding pads are usually located on or near the perimeter of the IC to avoid crossing one wire bond with another. While this approach has worked very well for many ICs, including CPLDs, alternative packaging techniques have been developed.

Another type of packing technique is commonly referred to as "flip-chip" bonding. One advantage of flip-chip packaging techniques over wire-bond packaging techniques is that the solder bumps on the IC are not limited to its perimeter. Small solder bumps are formed on the top of the IC in lieu of wire bonding pads. Corresponding bump lands are on the top surface of the base of a package. The IC is flipped over and aligned so that the solder bumps match the bump lands. The assembly is then heated to re-flow the solder bumps, which electrically and mechanically attach the flip-chip IC to the base of the package. Encapsulant or a cover is optionally placed over the IC.

The base of the package typically has metal traces that electrically connect the solder targets on the top of the base with contacts on the bottom of the base. In some applications, the traces essentially "spread out" the spacing between the solder targets on the top to another set of solder bumps or pins on the bottom of the package base. This is done to accommodate the generally higher critical dimension (i.e. minimum spacing) of the printed wiring board that the packaged IC is assembled on. In other words, the processes and materials used to fabricate the package base reliably produce more closely spaced solder targets and metal traces than the processes and materials used to fabricate the printed wiring board.

With high-speed ICs, which are generally ICs operating at a clock rate of 600 MHz or higher, reflections arising from impedance mismatches becomes an important consideration in the design of a packaged IC. Such ICs may include multi-gigabit transceivers ("MGTs") handling signals at 1.5 GHz and up. These signals are typically brought through a package to the IC on high-speed traces. For high-speed traces, it is generally desirable to maintain a characteristic impedance (e.g. 50 ohms) from the printed wiring board through the package into the receiving IC, and that the receiving IC provide a termination having the characteristic impedance. The package base is often a multi-layer structure with at least two layers of metallization. Planar transmission line structures having the characteristic impedance are formed in the base of the package to minimize reflections that can otherwise corrupt data transfer. However, reflections due to poor return loss occur if the IC does not provide a good termination.

Therefore, a flip-chip package that provides low return loss with an IC that does not provide a good termination is desirable.

SUMMARY OF THE INVENTION

A packaged integrated circuit includes an integrated circuit and a package substrate. A trace in the package substrate includes a first portion and a second, high-inductance, portion. The high-inductance portion of the trace is proximate to a port of the integrated circuit and provides a selected inductance operating in cooperation with the capacitance of the port to reduce return loss from the port.

BRIEF DESCRIPTION OF THE DRAWINGS

FIG. 1 is a plan view of an FPGA suitable for implementing embodiments of the invention.

DETAILED DESCRIPTION OF THE DRAWINGS

Figure 2A:
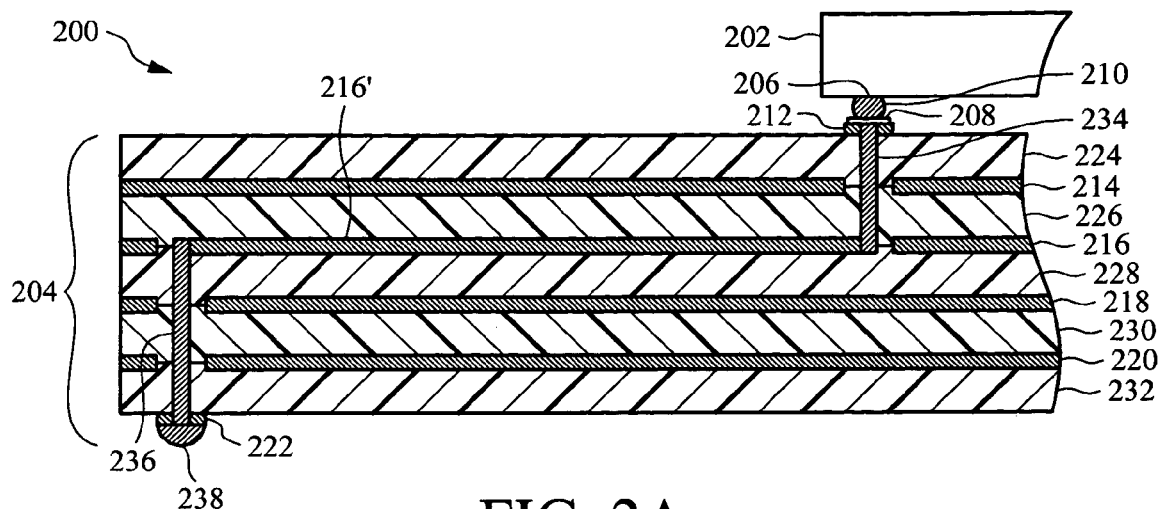
FIG. 2A is a cross section of a portion of a packaged IC suitable for embodiments of the invention.

As noted above, advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic.

FIG. 2A is a cross section of a portion of a packaged IC 200 suitable for embodiments of the invention. The packaged IC 200 includes a high-speed IC 202 mounted on a package substrate 204. The high-speed IC 202 has at least one high speed port 206 that is electrically and mechanically connected to a solder bump land 208 on the package substrate 204 with a solder bump 210. In a particular embodiment, the IC 202 is an FPGA. In a further embodiment, the high speed port 206 is a transceiver port of an FPGA. In a yet further embodiment, the high speed port 206 is one half of a pair of differential signal ports of an FPGA.

The package substrate 204 has a number of metal layers 212, 214, 216, 218, 220, 222 with intervening layers 224, 226, 228, 230, 232 of dielectric material. The package substrate is fabricated using known printed wiring board techniques, and the metal layers are deposited thin film layers, thick film layers, and patterned metal foil layers, for example. The dielectric layers are organic materials, such as epoxy or glass-loaded epoxy, ceramic, or other organic or inorganic material commonly used for the manufacturing of multi-layer printed wiring boards. Other package structures, such as a top underfill layer, top conformal coating, package lid, and heat spreaders, are omitted for simplicity of illustration.

The intervening layers of dielectric material typically have a known thickness and dielectric constant. This allows transmission lines having a characteristic impedance, such as microstrip transmission lines having a 50 ohm impedance, to be fabricated in the package substrate 204.

Using a transmission line having a characteristic impedance in the package substrate 204 is generally considered to be desirable because it provides a low-loss path through the substrate to the high-speed IC 202. Similarly, some types of transmission lines have shielding that lessens the electrical noise coupled to or from the transmission line.

Vias 234, 236 electrically connect metal layers 212, 216, 222. For example, the via 234 connects a portion of the third (from the top) metal layer 216' with the solder bump land 208, and the via 236 connects the portion of the third metal layer 216' with a solder ball 238 on the bottom of the package substrate 204. In some embodiments, the package substrate is a ball-grid array package substrate. Alternatively, the package substrate has pins for coupling the packaged IC to a circuit. In an embodiment, the portion of the third metal layer 216' is a center conductor in a transmission line, and one or both of the second metal layer 214 and the fourth metal layer 218 serve as a ground plane in a transmission line having a characteristic impedance over a first portion of the transmission line, and having a second, high-inductance impedance (i.e. higher inductance per unit length) over a second portion.

In some embodiments, center conductors for transmission lines connecting high-speed ports on an IC are formed in a metal layer commonly referred to as the "a" metal layer. A high-quality dielectric layer is formed between the "a" metal layer and a corresponding ground plane layer, and tolerances on the "a" metal layer are high, allowing precise transmission lines to be fabricated. Other connections are formed in other layers. For example, traces carrying DC bias, DC signals, and low-frequency AC signals do not require transmission lines having a selected impedance, and may be formed in other layers using lower-tolerance processes and materials.

Figure 2B:
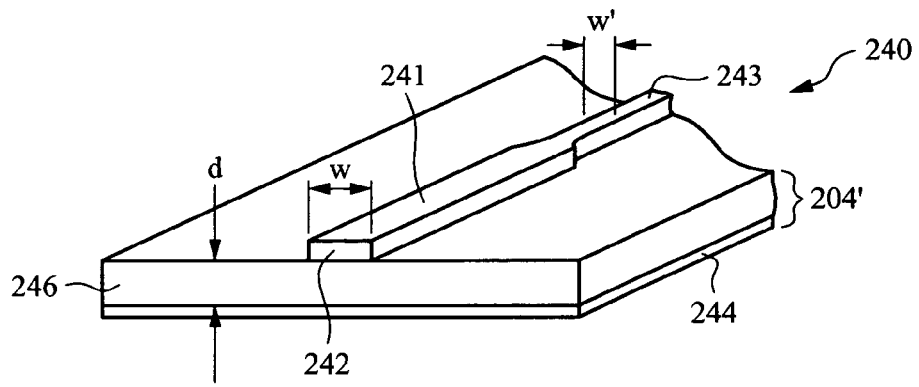
FIG. 2B is an isometric view of a microstrip transmission line according to an embodiment of the invention.

FIG. 2B is an isometric view of a microstrip transmission line 240, such as may be formed in a package substrate 204' according to an embodiment of the invention. Some layers of the package substrate 204' are omitted for ease of illustration, and the thickness of the metal layers is exaggerated. The microstrip transmission line 240 has a center conductor 242 separated from a ground plane 244 by a thickness of dielectric material 246. The characteristic impedance of a microstrip transmission line in a package substrate is a function of the width w, w' of the center conductor 242, the distance d between the center conductor 242 and the ground plane 244, and the dielectric constant of the dielectric material 246 between the center conductor and the ground plane, as well as other factors. Selecting the appropriate widths, thicknesses, and distances to achieve a desired characteristic impedance is well-known in the art. Hence, the microstrip transmission line 240 has a first portion 241 with an impedance according to a first width "w," and a second portion 243 with an impedance according to a second width "w'," which has a higher inductance per unit length. The total inductance of the high-inductance portion of the second portion is essentially the length of the second portion multiplied by the inductance per unit length.

Many high-speed ICs that were packaged using wire-bond techniques did not operate as well when they were packaged using flip-chip techniques. This was surprising because the flip-chip approach allowed a transmission line with a well-characterized impedance to be brought to the solder bump land of the package substrate, allowing a low-inductance connection to the high-speed port of the IC through the relatively short wire bond. It was thought that the flip-chip approach would improve performance of the packaged IC by avoiding the inductance associated with a wire bond. High inductance in the transmission path is generally avoided because it can "choke" high-frequency signals.

Investigation of packaged high-speed ICs using time-domain reflectometry showed that a portion of the high-frequency signal provided to the packaged IC was being reflected at the high-frequency port of the IC. The return loss measured at this transition corresponded to a 30-35 ohm termination, whereas the design impedance of the system (i.e. the characteristic impedance of the transmission line in the package substrate and the load impedance expected by the transmitting device (source)) was 50 ohms.

Further investigation found that the capacitance on some high-speed ports of ICs was as high as 3 pico-Farads ("pfs"). This relatively high capacitance is consistent with the low observed termination impedance and increased return loss. While reducing the capacitance is an option that can be considered when designing future ICs, the present invention provides solutions for current high-speed ICs that are packaged in a flip-chip package without having to re-design the IC to have less input capacitance. Alternatively, the high-speed port is an output port, and embodiments of the invention are applied to reduce the return loss at an output port.

Increasing the inductance of the center conductor of the transmission line through the package substrate for a short distance at the IC end provides an inductance that operates in combination with a high (i.e. greater than about 3 pf) input capacitance at the IC to provide the desired termination impedance (e.g. 50 ohms). The physical length of the portion of the center conductor with increased inductance is selected to be sufficiently short so at to have a short electrical length. In typical embodiments, the electrical length of the high-inductance portion of the transmission line is less than about 0.2 wavelength at the design frequency (e.g. maximum operating frequency of the IC). In other embodiments, the electrical length of the high-inductance portion is less than about 0.1 wavelength at the design frequency. Keeping the electrical length of the high-inductance portion short is important to avoid reflections from the transition from the portion of the transmission line with the characteristic impedance (e.g. the 50-ohm portion) to the high-inductance portion. It is further important that the high-inductance portion is proximate to the high-capacitance high-frequency port of the IC so that the high inductance of that portion of the transmission line combine with the high capacitance of IC to provide a load termination impedance that reduces reflections (i.e. increases the return loss) from the packaged IC.

Figure 3A:
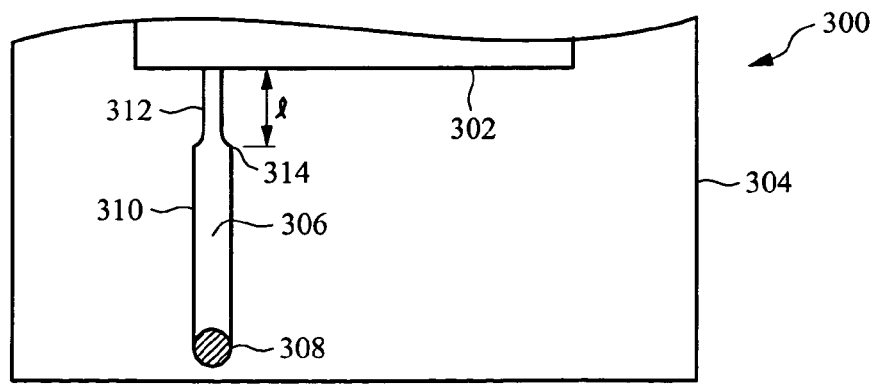
FIG. 3A is a plan view of a packaged IC according to embodiments of the invention.

FIG. 3A is a plan view of a packaged IC 300 according to embodiments of the invention. A high-speed IC 302 is flip-chip bonded to a package substrate 304. Upper layers of the package substrate are removed to expose a center conductor 306 of a transmission line. A via 308 connects the center conductor 306 to a solder ball or pin (not shown) on the bottom of the package substrate 304.

The center conductor 306 has a first portion 310 that typically has a characteristic impedance matched to the system that the packaged device will be used in (e.g. 50 ohms), and a second portion 312 that is less wide and forms a high-inductance section proximate to the IC 302. The length "l" 303 of the second portion (which extends to a high-speed port (not shown) on the IC 302) has an electrical length less than about 0.2 wavelengths at a maximum operating frequency of the IC so that the second portion of the center conductor provides an inductance that acts in conjunction with a capacitance of the high-speed port to provide a termination impedance closer to the characteristic system impedance. Keeping the electrical length short also avoids reflections from the transition 314 between the first and second portions of the center conductor.

Having a termination impedance closer to the characteristic system impedance reduces the reflections (reduces the return loss) from the high-speed port, which otherwise can result in data transmission errors. For example, with an IC having a high-speed port and an input capacitance greater than 3 pf, connecting the high-speed port to a 50-ohm transmission line results in a termination impedance of 35 ohms and a return loss of about −8 dB (measured at the package substrate solder bump), and in another instance a high-speed port had a return loss of only −5 dB (measured at the package substrate solder bump). Return loss is expressed as a negative number; thus, "reducing" return loss means that the return loss is reduced from −8 dB to −12 dB, for example. The lower (i.e. more negative) the return loss, the less reflections occur.

Using a high-inductance center conductor for a portion of the transmission line produces a return loss of about −10 dB. The measured return loss for the package substrate with a 50-ohm transmission line connected to a 50-ohm resistor (i.e. an essentially perfect 50-ohm termination) was −25 dB. It is generally desirable to have a return loss less than at least about −8 dB to avoid errors in data transmission.

High-speed signals in ICs are often implemented as differential signals, and the traces in the corresponding package substrate are differential pairs.

Figure 3B:
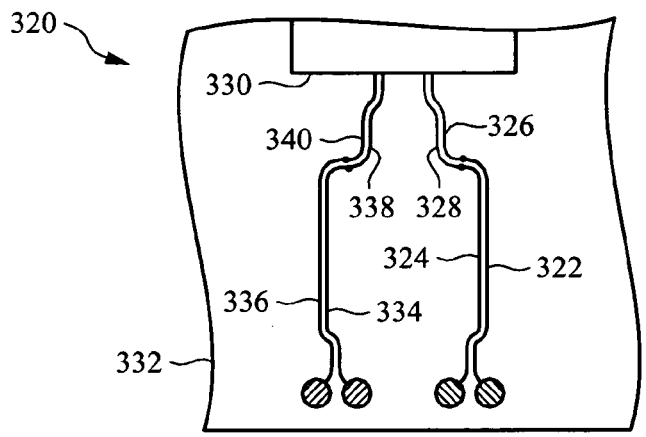
FIG. 3B is a plan view of a packaged IC illustrating embodiments of the invention.

FIG. 3B is a plan view of a packaged IC 320 illustrating embodiments of the invention. The package substrate 332 includes a first trace 322 and a second trace 324 for carrying differential signals. Each trace has a high-inductance portion 326, 328 proximate to the IC 330. As in FIG. 3A, upper layers of the package substrate 332 have been removed to expose the traces. The high-inductance portions 326, 328 are formed in the same metal layer as the remainder of the differential traces 322, 324. Alternatively, the high-inductance portions are formed in a different metal layer than the remainder of the differential traces.

FIG. 3B also shows a second pair of differential traces 334, 336 with high-inductance portions 338, 340. A ground plane layer (not shown) is further away from the high-inductance portions of the traces than the remaining portions. In one embodiment, the high-inductance portions are in the same metal layer as the rest of the pair of traces, and the ground plane is on a different level in the high-inductance region. Alternatively, the high-inductance portions of the traces are in a different metal layer than the remainder of the traces, and are farther away from a common ground plane.

Figure 3C:
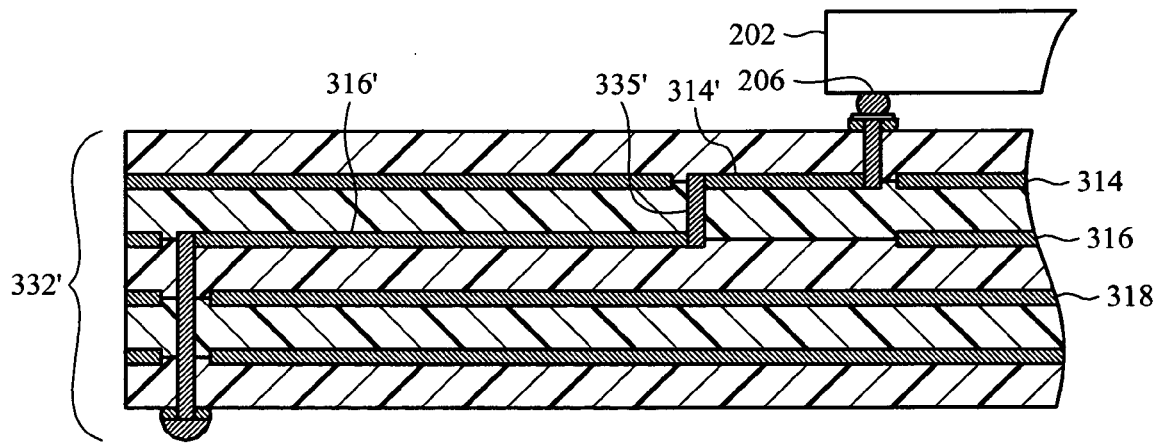
FIG. 3C is a cross section of a package substrate showing a trace having a first portion in a first metal layer and a second portion in a second metal layer.

FIG. 3C is a cross section of a package substrate 332' showing a trace having a first portion 316' in a first metal layer 316 and a second portion 314' in a second metal layer 314. The second portion 314' of the trace is further away from a ground plane 318 than the first portion 316', and has higher inductance than the first portion, which has the characteristic impedance of the system. A via 335' connects the first portion 316' to the second portion 314' of the trace. The second portion 314' of the trace is proximate to the IC 202 so that the inductance of the second portion 314' of the trace cooperates with an input capacitance of a high speed port 206 of the IC 202 to reduce return loss.

Figure 3D:
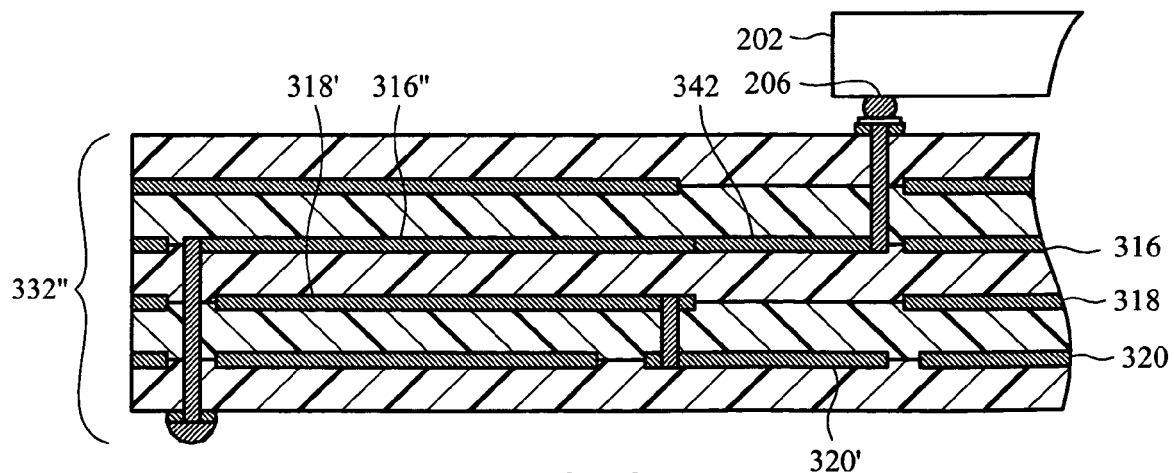
FIG. 3D is a cross section of a package substrate showing a trace having a first portion in a first metal layer and a second portion in the first metal layer.

FIG. 3D is a cross section of a package substrate 332" showing a trace having a first portion 316" in a first metal layer 316 and a second portion 342 in the first metal layer 316. The first portion 316" of the trace cooperates with a ground plane 318' in a second metal layer 318 to form a planar transmission line having the characteristic impedance of the system, and the second portion 342 of the trace cooperates with a second ground plane 320' formed in a third metal layer 320 to form a high-inductance portion of the trace (i.e. a portion having higher inductance of the first portion) proximate to the IC 202 so that the inductance of the second portion 342 of the trace cooperates with a capacitance of the high-speed port 206 of the IC 202 to reduce return loss.

Figure 3E:
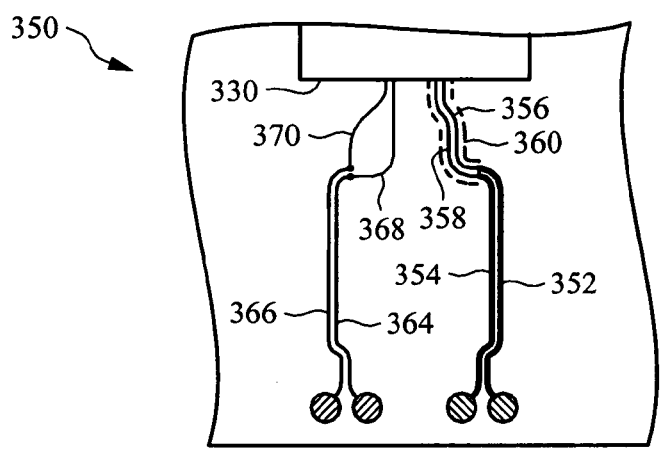
FIG. 3E is a plan view of a packaged IC according to other embodiments of the invention.

FIG. 3E is a plan view of a packaged IC 350 according to other embodiments of the invention. A first pair of differential traces 352, 354 have high-inductance portions 356, 358 according to an embodiment of the invention. The high-inductance portions 356, 358 are connected to differential high-speed inputs (not shown) of the IC 330. A ground plane is removed from above and/or below the high-impedance portions of differential traces. The missing ground plane is on a different metal layer than the traces, and is represented as a dotted line 360 (see also FIG. 3F). The high-impedance portions 356, 358 are narrower than the remainder of the differential traces. Alternatively, the high-impedance portions are the same width as the remainder of the differential traces. The high-impedance portions 356, 358 are in the same metal layer at the remainder of the differential traces in some embodiments, and are on a different metal layer than the remainder of the differential traces in alternative embodiments.

A second pair of differential traces 364, 366 have second high-inductance portions 368, 370 connected to a second set of high-speed differential input ports (not shown) of the IC 330. Compare the high-inductance portions of the other differential traces 356, 358. The proximity of the traces allows cross-coupling, which reduces inductance. In this embodiment, the high-inductance portions 368, 370 are separated from one another, increasing inductance. Inductance is also increased because the lengths of the high-inductance portions are longer.

However, in each embodiment, the length of the high-inductance portion of a trace is selected to provide the desired total inductance to cooperate with the input capacitance of the high-speed port of the IC. The length of the high-inductance portion is further selected so that it is much less than an electrical wavelength at the maximum operating frequency of the IC, and in some embodiments is less than 0.2 electrical wavelengths, and in other embodiments is less than 0.1 electrical wavelengths.

Figure 3F:
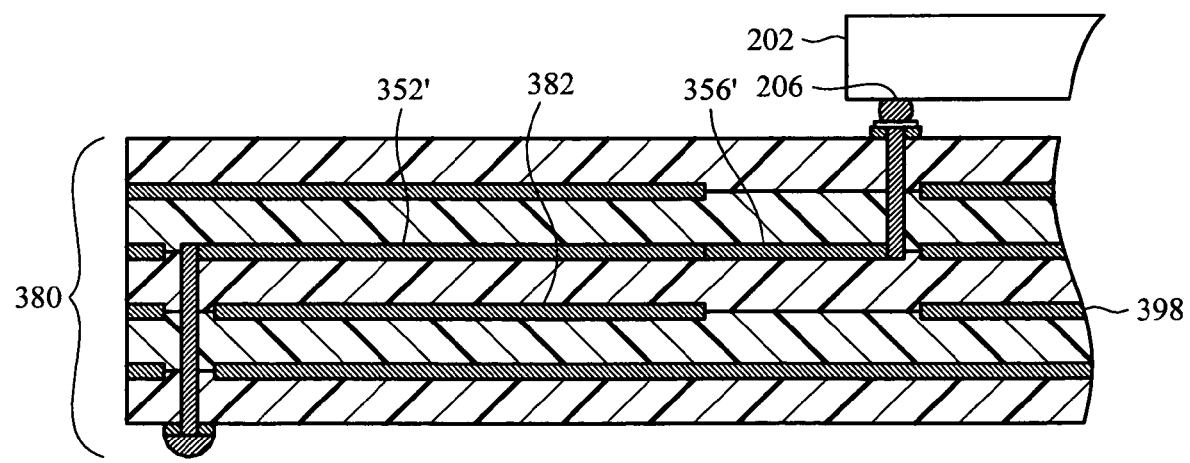
FIG. 3F is a cross section of a package substrate with an IC having a port.

FIG. 3F is a cross section of a package substrate 380 with an IC 202 having a port 206. A first portion 352' of a trace in cooperation with a ground plane 382 forms a transmission line having a characteristic impedance. A portion of the metal layer 398 has been removed from beneath a second portion 356' of the trace. The second portion 356' of the trace is a high-inductance portion because it does not cooperate with the ground plane 382 of the first transmission line, and operates similarly to a bare wire. Alternatively, the ground plane is above the trace, or there is one ground plane above the trace, and one ground plane below the trace. In some embodiments, the first and second portions of the trace have the same width. In other embodiments, the second portion of the trace is narrower, which increases the inductance of the second portion. In an alternative embodiment, the second portion of the trace is on a different metal layer than the first portion of the trace. In a particular embodiment, the second portion of the trace is formed in the same metal layer as the ground plane that cooperates with the first portion of the trace.

Some embodiments of the invention incorporate a number of techniques illustrated above. For example, a high-impedance trace may be narrower (as in FIG. 3B, ref. nums. 326, 328) and have the ground plane removed or set back (as in FIG. 3E, ref. num. 360). The width of high-inductance portions of traces is usually limited by practical considerations, such as the critical feature size of the processes used to fabricate the package substrate, cracking of metal traces that are too narrow, and a minimum cross section for carrying the desired current in some applications. Therefore, narrowing the trace to form a high-inductance portion may not be sufficient for some applications.

In a particular embodiment, the high-inductance portion of a trace is narrower than the portion having the characteristic impedance of the system, and the ground plane is removed proximate to the high-inductance portion of the trace. The combination of narrowing the trace and removing the ground plane is particularly desirable for obtaining inductance sufficient to cooperate with the input capacitance of an high-speed port of an IC to provide a good termination impedance, while keeping the electrical length of the high-inductance portion of the trace sufficiently short so that the high-inductance portion operates essentially as a lumped element in cooperation with the input capacitance of the high-speed port.

While the present invention has been described in connection with specific embodiments, variations of these embodiments will be obvious to those of ordinary skill in the art. Therefore, the spirit and scope of the appended claims should not be limited to the foregoing description.

The invention claimed is:

1. A packaged integrated circuit comprising:
   an integrated circuit having a port with a capacitance;
   a package substrate having a transmission line with a center conductor trace including
      a first portion having a first inductance, and
      a second portion proximate to the port of the integrated circuit providing a second inductance greater than the first inductance, the second inductance operating in cooperation with the capacitance to reduce return loss from the port;
   a conductive via; and
   an electrical connection connecting the port to the second portion of the center conductor trace through the conductive via.

2. The packaged integrated circuit of claim 1 wherein the capacitance is greater than 3 pf.

3. The packaged integrated circuit of claim 2 wherein the return loss is less than −10 dB.

4. The packaged integrated circuit of claim 1 wherein the electrical connection comprises a solder ball coupling the integrated circuit to the package substrate.

5. The packaged integrated circuit of claim 1 wherein the integrated circuit is a flip-chip circuit and the package substrate is a ball-grid array package substrate.

6. The packaged integrated circuit of claim 5 wherein the flip-chip circuit is a flip-chip field-programmable gate array.

7. The packaged integrated circuit of claim 1 wherein the first portion of the center conductor trace is part of a transmission line having a characteristic impedance.

8. The packaged integrated circuit of claim 7 wherein the characteristic impedance is fifty ohms.

9. The packaged integrated circuit of claim 1 wherein the port is a transceiver port.

10. The packaged integrated circuit of claim 1 wherein the second portion is narrower that the first portion.

11. The packaged integrated circuit of claim 1 wherein the second portion of the center conductor trace has an electrical length less than 0.2 wavelengths of a maximum operating frequency of the integrated circuit.

12. The packaged integrated circuit of claim 1 wherein the second portion of the center conductor trace has an electrical length less than 0.1 wavelengths of a maximum operating frequency of the integrated circuit.

13. A packaged integrated circuit comprising:
    means for providing an input port having a capacitance;
    means for coupling a high-frequency signal through a package to the input port, said means for coupling including
    means for selectively increasing an inductance of a center conductor of a transmission structure in a metal trace of a package substrate proximate to the capacitance so as to reduce return loss from the input port through the package.

* * * * *